United States Patent [19]
Nowak et al.

[11] Patent Number: 6,054,354
[45] Date of Patent: Apr. 25, 2000

[54] HIGH VOLTAGE FIELD EFFECT TRANSISTORS WITH SELECTIVE GATE DEPLETION

[75] Inventors: Edward J. Nowak; Minh Ho Tong, both of Essex Junction, Vt.

[73] Assignee: International Business Machines Corporation, Armonk, N.Y.

[21] Appl. No.: 09/014,889

[22] Filed: Jan. 28, 1998

[51] Int. Cl.⁷ .................... H01L 21/8234; H01L 21/8236
[52] U.S. Cl. .......................... 438/275; 438/276; 257/204
[58] Field of Search ...................... 438/275, 227, 438/231, 228, 239, 451

[56] References Cited

U.S. PATENT DOCUMENTS

| | | | |
|---|---|---|---|
| 5,254,487 | 10/1993 | Tamagawa | 438/228 |
| 5,296,401 | 3/1994 | Mitsui et al. | 438/231 |
| 5,449,637 | 9/1995 | Saito et al. | 438/275 |
| 5,468,666 | 11/1995 | Chapman | 438/275 |
| 5,480,828 | 1/1996 | Hsu et al. | 438/275 |
| 5,698,458 | 12/1997 | Hsue et al. | 438/451 |
| 5,712,201 | 1/1998 | Lee et al. | 438/239 |

FOREIGN PATENT DOCUMENTS 61-179577  8/1986  Japan .

OTHER PUBLICATIONS

English language abstract of Japanese Patent number 61–179577

*Primary Examiner*—Wael Fahmy
*Assistant Examiner*—William David Coleman
*Attorney, Agent, or Firm*—Whitham, Curtis & Whitham; Howard J. Walter

[57] ABSTRACT

A method of forming field effect transistors (FETS) on a silicon wafer. A gate layer, polysilicon, is formed on a gate dielectric layer (oxide) on the silicon wafer. High voltage device locations are defined and blocked while normal NFETs and PFETs are formed. If the FET process is a gate predope process, the gate layer is blocked during predoping and patterned after the predoping is complete. Otherwise, the gate layer is patterned prior to doping. After gate definition, high voltage FETs are unblocked and implanted with a dopant, preferably boron (B) or (P), which dopes gates and source/drain regions such that they are depleted, resulting in a thicker effective gate dielectric than normal NFETs and PFETs.

31 Claims, 2 Drawing Sheets

HIGH VOLTAGE FIELD EFFECT TRANSISTORS WITH SELECTIVE GATE DEPLETION

BACKGROUND OF THE INVENTION

1. Field of the Invention

The present invention generally relates to semiconductor chip manufacturing processes and more particularly to field effect transistor manufacturing processes that form devices with different operating voltages, but a single gate oxide thickness.

2. Background Description

Performance is a primary goal of logic design. Thus, to improve performance in field effect transistor (FET) integrated circuits (ICs) device features are constantly being shrunk. As device features shrink, FET gate insulator, i.e., gate oxide is being thinned and circuit/device operating voltages are being reduced, e.g., from 2.5 volts to 1.75 or 1.5 volts.

However, in some cases, state of the art IC chips are intended to be interfaced with otherwise incompatible, higher voltage IC chip families, e.g. 2.5 volts. These higher voltages increase the electric field across the devices' gate oxide such that these state of the art devices fail catastrophically, i.e., they are destroyed.

Further, a typical logic chip's input/output (I/O) circuit and the devices therein experience voltage overshoots and undershoots that require special decoupling. However, I/O circuits must accommodate these departures from normal operating voltages. Thus, even IC chips designed with a single gate oxide thickness and for a single operating voltage, for example, for 1.75 volts, have increased I/O circuit design complexity to accommodate these higher voltages. These I/O circuits could be simplified by increasing device gate oxide thickness, which would make the I/O circuits capable of handling the higher voltages. However, the increased oxide thickness comes, typically, at a price of degrading the rest of the chip's performance.

Consequently, efforts are made, constantly, to reduce the electric field across the gate oxide of FETs, both N-type FETs (NFETs) and P-type FETs (PFETs), without degrading the FET's performance. To that end, U.S. Pat. Nos. 5,471,081 and 5,523,603, both entitled "Semiconductor Device with Reduced Time-Dependent Dielectric Failures", both to Fishbein et al., U.S. Pat. No. 5,480,830 entitled "Method of Making Depleted Gate Transistor for High Voltage Operation" to Liao et al., and U.S. Pat. No. 5,637,903 entitled "Depleted Gate Transistor For High Voltage Operation" to Liao et al. (referred to herein collectively as "Fishbein and Liao") teach FETs made such that their gates remain depleted, increasing the effective thickness of the FET's gate oxide. This increased effective gate oxide thickness from the depleted gate provides some measure of increased operating voltage capability.

However, FETs as taught in Fishbein and Liao still suffer from high voltage gate to drain failures. When the drain of a Fishbein and Liao NFET is raised to, for example 2.5 volts (for a 1.75 volt process), with its gate at ground, the device's gate accumulates, nullifying the effect of the depleted gate, reducing the effective gate oxide thickness. Under these circumstances, the Fishbein and Liao device may break down at its drain.

Thus, there is a need for IC chips capable of tolerating a wider range of on-chip voltages, especially in chip input and output circuits, that do not impact circuit performance and design flexibility.

SUMMARY OF THE INVENTION

It is therefore an object of the present invention to reduce IC chip, high voltage failures.

It is another object of the present invention to improve the reliability of IC chips.

It is yet another object of the present invention to improve the reliability of IC chips without impacting chip performance.

These and other objects of the present invention are achieved by providing a method of forming field effect transistors (FETs) on an insulator or on a silicon wafer, wherein some of the FETs, referred to as high voltage FETs, have a thicker effective gate oxide thickness than the rest of the transistors on the same chip or wafer. A gate layer (polysilicon) is formed on a gate dielectric or oxide layer on a silicon surface layer or on the silicon wafer. High voltage device locations are defined and blocked while normal NFETs and PFETs are formed.

In an alternate embodiment, when the FET process is a gate predope process, the gate layer is blocked during predoping and patterned after the predoping is complete. Otherwise, the gate layer is patterned prior to doping. After gate definition, high voltage FETs are unblocked and implanted with a dopant, preferably boron for PFETs or phosphorous for NFETs. The dopant dopes gates and source/drain diffusion regions such that they are much more depleted than normal NFETs and PFETs. As a result the high voltage FETs have a thicker effective gate oxide than normal NFETs and PFETs.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
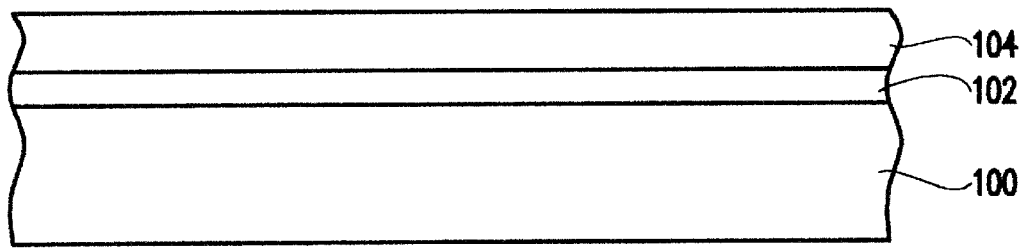
FIG. 1 shows a gate layer formed on a substrate according to the preferred embodiment of the present invention.

Referring now to the drawings, and more particularly to FIG. 1, which shows a semiconductor layer 100 that may be a silicon layer on an insulator (SOI) IC chip but, preferably, is a bulk silicon wafer. A gate dielectric layer 102, preferably, $SiO_2$ is formed on the semiconductor layer 100. A gate layer 104, preferably polysilicon, is formed on the gate dielectric layer 102.

Figure 2:
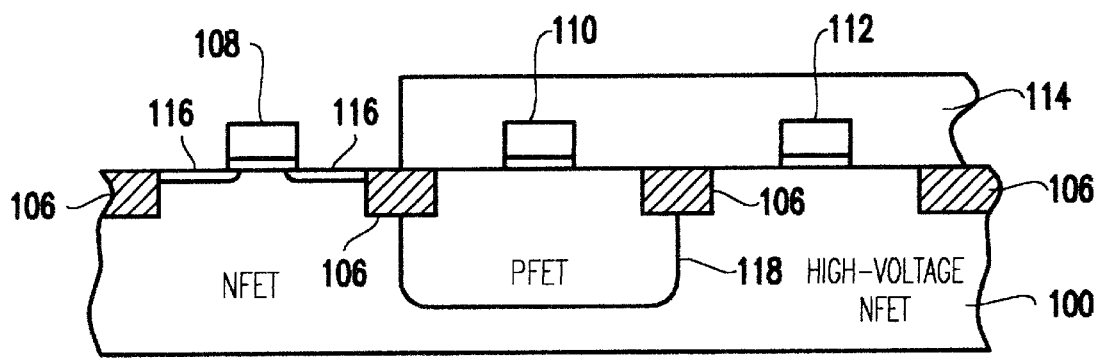
FIG. 2 shows gates patterned from the gate layer of FIG. 1 according to the preferred embodiment of the present invention.

The gate layer 104 and gate dielectric layer 102 are patterned and shallow trench isolation (STI) regions 106 in FIG. 2 formed in semiconductor layer 100, to define field effect transistors (FETs). Typically, STI regions 106 are formed prior to forming the gate layer 104. Gate 108 identifies an N-type FET (NFET), gate 110 identifies a P-type FET (PFET) and gate 112 identifies a high voltage NFET.

As used herein, "high voltage" refers to FETs that are capable of withstanding higher terminal voltages than normal NFET 108 and normal PFET 110. Further, for simplicity, only the process of making high voltage NFETs is described in detail. It is understood, however, that high voltage PFETs may be formed by a person skilled in the art with appropriate process substitution, such as dopant types.

Thus, for a FET technology wherein a typical NFET has a gate oxide thickness of 4 nm and a quarter micron (0.25 $\mu$m) critical dimension, the normal operating voltage is 1.8 V and the preferred high voltage NFET is capable of operating at 2.5 V. This higher operating voltage capability is achieved by selectively doping the high voltage device's gate and source/drain diffusions with phosphorous at $1 \times 10^{15} \text{cm}^{-2}$ and at an implant energy of sixty thousand electron volts (60 keV). As a result of this device doping, when the device is turned off, i.e., when the gate 112 is low and the drain is at 2.5 V, the high voltage NFET's drain diffusion is depleted in the gate overlap region. Similarly, when the device is on, i.e., when its gate 112 is high, the high voltage NFET's gate is depleted.

In the preferred embodiment, a blocking mask covers the high voltage NFET while normal lower voltage devices are formed to avoid overdosing. Then, after forming the lower voltage devices, one or more high voltage NFETs are formed as described hereinbelow.

Thus, gates 108, 110 and 112 are covered with photoresist that is patterned to form a blocking mask 114 which is left covering gates 110 and 112, while leaving exposed normal, lower voltage N-type gate 108 and its adjacent source/drain areas 116. N-well 118, formed at an appropriate N-well definition step is shown under gate 110, the gate of what will be a normal PFET. Phosphorous (P), typically, 4–5× $10^{15} \text{cm}^{-2}$ at an implant energy of fifteen to twenty five thousand electron volts (15–25 keV)and preferably, $5 \times 10^{15} \text{cm}^{-2}$ at 15 keV is blocked by blocking mask 114 as it is implanted into exposed gate 108 and source/drain areas 116. After a rapid thermal anneal (RTA) step at or below 1000° C. to activate the phosphorous, gate 108 and N-type source/drain regions 116 form a normal NFET 120.

Figure 3:
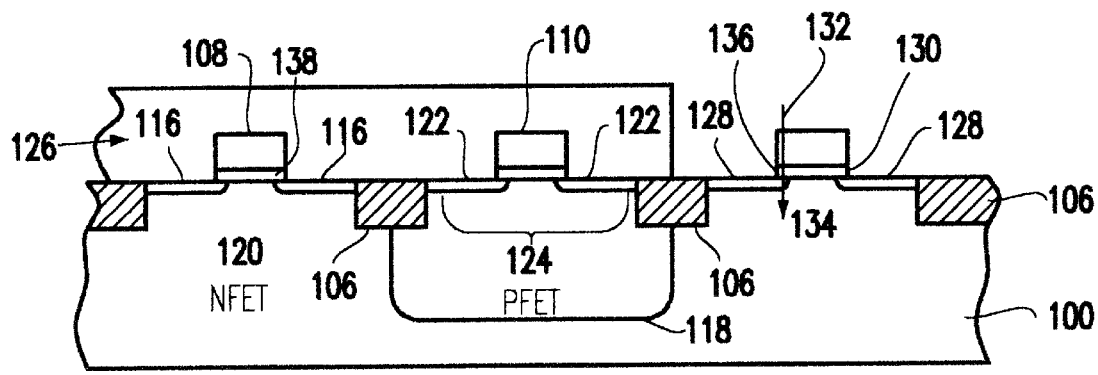
FIG. 3 shows a preferred embodiment high voltage FET formed on the same wafer as a normal NFET and PFET.

Next, the blocking mask 114 is removed and a second blocking mask (not shown) is formed, leaving exposed P-type gate 110 and its adjacent source/drain areas 122 on N-well 118. The blocking mask is formed over the high voltage gates 112 to prevent implanting P-type dopants into the high voltage NFET structure. A P-type dopant, preferably boron is implanted into the exposed gate 110 and source/drain areas 122. Thus, after implant and diffusion, gate 110 and source/drain diffusions 122 form PFET 124 in FIG. 3.

Next, a third blocking mask 126 is formed over normal NFET 120 and normal PFET 124, leaving exposed the high voltage gates 112 and its source/drain areas 128, which are, then, implanted with arsenic (As), P or a combination thereof. Preferably, doping is with phosphorous at 1–2× $10^{15} \text{cm}^{-2}$, preferably $1.5 \times 10^{15} \text{cm}^{-2}$ at an implant energy of 60 keV.

Figure 4:
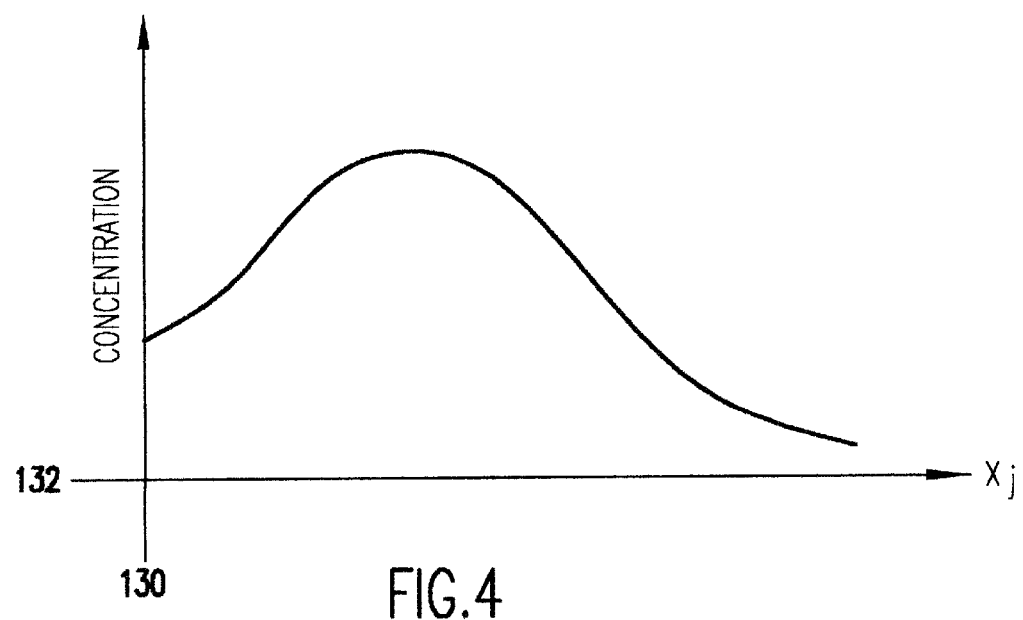
FIG. 4 is a plot of dopant density versus depth ($X_j$) in high voltage NFET diffusions.

To meet the high voltage (2.5 V) requirement, the selected dopant dose and energy must be such that the gate of the high voltage FET is in partial depletion at the gate oxide; and, even when the device is off, and the source and drain are high, the source/drain diffusions 116 are depleted at the surface 130 near the gate 112. Thus, the high voltage NFET diffusions 128 have a vertical dopant density gradient as shown in FIG. 4, which is a plot of dopant density versus depth ($X_j$) along arrow 132. A normal FET 120 or 124, by contrast, relatively, has a higher, more abrupt concentration profile.

Thus, because the diffusion doping profile of the high voltage NFET is about $1.5 \times 10^{20} \text{cm}^{-3}$ near the surface, the resulting device 134 has an effective gate oxide 136 thickness that is significantly thicker, e.g. 20% thicker, than the gate dielectric layer 138 of normal NFET 120 or PFET 124. So, the maximum operating voltage of the high voltage FET is elevated above, and, has an oxide voltage field upper limit above that of the normal, lower voltage NFET 120. Furthermore, the dopant gradient for the high voltage NFET's diffusions increases its source/drain 128 junction breakdown voltage.

An alternate embodiment of the present invention is employed when the polysilicon layer 104 is pre-doped with phosphorous, prior to gate definition. Thus, in this embodiment, instead of applying the first blocking mask 114 to the structure of FIG. 2, it is applied to the unpatterned gate layer 104 of FIG. 1. The blocking mask prevents inadvertent doping of the gates of any high voltage FETs and the normal PFETs with the pre-dope implant.

After pre-doping, the gate layer 104 is patterned and normal NFETs and PFETs are formed as described above for FIG. 2, except that arsenic is implanted to form NFET source/drain diffusions 116, 128. However, the gate 112 of high voltage NFET 134 is also implanted with As coincident with source/drain diffusions 116, 128. Then, both types of devices may be annealed at a temperature of about 1000° C. Annealing and any subsequent processing must be done at or below 1000° C. to limit arsenic activation.

As a result, normal FETs have low gate depletion due to the pre-dope phosphorous implant but, the lack of phosphorous and low activation rate of the implanted arsenic increases gate depletion in the second embodiment high voltage FETs.

While the invention has been described in terms of preferred embodiments, those skilled in the art will recognize that the invention can be practiced with modification within the spirit and scope of the appended claims.

We claim:

1. A method for forming field effect transistors (FETs) on a wafer comprising the steps of:
    a) forming a gate dielectric layer on a semiconductor layer;
    b) forming a gate layer on said gate dielectric layer;
    c) blocking at least one area of said gate layer, said blocked area including a first FET;
    d) forming at least a second FET in areas not blocked;
    e) doping said second FET; and
    f) unblocking said first FET, and implanting a dopant into a gate and source/drain regions of said first FET, said gate being depleted at said gate dielectric layer and said source/drain regions being depleted at said gate dielectric layer, such that said first FET has a thicker effective gate dielectric than said second FET,
    wherein said second FET is subjected to only one doping step, said one doping step corresponding to step (e).

2. The method of claim 1, wherein said gate dielectric layer at said first FET and said second FET are substantially of a same actual thickness.

3. The method of claim 2 wherein the unblocking and implanting step (e) comprises implanting phosphorous to a concentration of $1.5 \times 10^{20} \text{cm}^{-3}$.

4. The method of claim 3 wherein the gate layer is a polysilicon layer and the phosphorous is implanted at an implant energy of 60 keV.

5. The method of claim 3 wherein the wafer is a silicon wafer.

6. The method of claim 5, wherein the semiconductor layer is the silicon wafer, and the gate layer is a polysilicon layer formed on a gate oxide layer included in said gate dielectric layer on the silicon wafer.

7. The method of claim 6 wherein the gate layer is patterned to form FET gates before the blocking step (c).

8. The method of claim 6 wherein the gate layer is patterned to form FET gates after the blocking step (c).

9. The method of claim 3 wherein the wafer is a silicon wafer.

10. The method of claim 9, wherein the semiconductor layer is the silicon wafer, and the gate layer is a polysilicon layer formed on a gate oxide layer included in said gate dielectric layer on the silicon wafer.

11. The method of claim 10 wherein the gate layer is patterned to form FET gates before the blocking step (c).

12. The method of claim 11 wherein the gate layer is patterned to form FET gates after the blocking step (c).

13. The method of claim 1, wherein said implanting step includes implanting said gate and said source/drain regions of said FET operating at said first operating voltage with phosphorus at a dose lying in a range of between $1\times10^{15}$ cm$^{-2}$ and $2\times10^{15}$ cm$^{-2}$ and at an implant energy of 60 keV.

14. The method of claim 1, wherein said first FET operates at an operating voltage higher than an operating voltage of said second FET as a result of said first FET having a thicker effective gate dielectric than said second FET.

15. A method of forming field effect transistors (FETs) on a wafer, comprising the steps of:
   a) forming a gate dielectric layer on a semiconductor layer;
   b) forming a gate layer on said gate dielectric layer;
   c) patterning said gate layer to define a plurality of FET gates;
   d) selecting at least one of said FET gates as corresponding to a high voltage FET and selecting another of said FET gates as corresponding to a low voltage FET, and blocking said high voltage FET;
   e) doping said low voltage FET;
   f) unblocking said high voltage FET;
   g) blocking said low voltage FET; and
   h) implanting a dopant into said high voltage FET, said gate of said high voltage FET being depleted at said gate dielectric layer and said high voltage FET further having source/drain regions depleted at said gate dielectric layer, such that said high voltage FET has a thicker effective gate dielectric than said low voltage FET,
   wherein said low voltage FET is subjected to only a single doping step, said single doping step corresponding to step (e).

16. The method of claim 15, wherein said gate dielectric layer at said high voltage FET is substantially of a same actual thickness as said gate dielectric layer at said second FET.

17. The method of claim 16, wherein the implanting step (g) comprises implanting phosphorus to a concentration of $1.5\times10^{20}$ cm$^{-3}$.

18. The method of claim 17 wherein the wafer is a silicon wafer, the semiconductor layer is the silicon wafer, the gate layer is a polysilicon layer formed on a gate oxide layer of said gate dielectric layer on the silicon wafer and the phosphorous is implanted at an implant energy of 60 keV.

19. The method of claim 17 wherein the semiconductor layer is an insulating layer, the semiconductor layer is a silicon layer on the insulating layer, the gate layer is a polysilicon layer formed on a gate oxide layer of said gate dielectric layer on the silicon wafer and the phosphorous is implanted at an implant energy of 60 keV.

20. A method of forming field effect transistors (FETs) on a wafer comprising the steps of:
   a) forming a gate dielectric layer on a semiconductor layer;
   b) forming a gate layer on said gate dielectric layer;
   c) defining at least one high voltage FET area and blocking said defined area of said gate layer;
   d) doping unblocked areas of said gate layer, said unblocked area including at least one low voltage FET area;
   e) patterning said gate layer to define a plurality of FET gates;
   f) unblocking one of said plurality of FET gates in said high voltage FET area; and
   g) implanting a dopant into said high voltage FET area to form a high voltage FET, a gate of said high voltage FET being depleted at said gate dielectric layer and said high voltage FET further having source/drain regions depleted at said gate dielectric layer, such that said high voltage FET has a thicker effective gate dielectric than a FET in said additional FET area,
   wherein said low voltage FET is subjected to only a single doping step, said single doping step corresponding to step (d).

21. The method of claim 20, wherein said gate dielectric layer at said high voltage FET is substantially of a same actual thickness as said gate dielectric layer of the FET in said additional area.

22. The method of claim 21 wherein the implanting step (g) comprises implanting phosphorous to a concentration of $1.5\times10^{20}$ cm$^{-3}$.

23. The method of claim 22 the wafer is a silicon wafer, the semiconductor layer is the silicon wafer, the gate layer is a polysilicon layer formed on a gate oxide layer of said gate dieletric layer on the silicon wafer and the phosphorous is implanted at an implant energy of 60 keV.

24. The method of claim 22 wherein the semiconductor layer is an insulating layer, the semiconductor layer is a silicon layer on the insulating layer, the gate layer is a polysilicon layer formed on a gate oxide layer of said gate dielectric layer on the silicon wafer and the phosphorous is implanted at an implant energy of 60 keV.

25. A method for forming a semiconductor device which includes a plurality of field-effect transistors (FETs), said method comprising steps of:
   forming a gate dielectric layer on a semiconductor layer;
   forming a gate layer on said gate dielectric layer;
   patterning said gate dielectric layer and said gate layer to form gates of two FETs;
   blocking at least the gate of the first FET;
   implanting a dopant under a first set of implanting conditions into the gate and source/drain regions of the second FET, said implanting step being the only implanting step performed the gate and source/drain regions of the second FET;
   blocking the gate and source/drain regions of the second FET, said gate dielectric layer at the first FET being substantially of a same thickness as said gate dielectric layer of said second FET;
   implanting a dopant under a second set of implanting conditions into the gate and source/drain regions of the first FET, said second implanting step including selecting said second set of implanting conditions so that gate and source/drain regions of the first FET are depleted at the gate dielectric layer, resulting in the first FET having an effective gate dielectric thicker than the second FET.

26. The method of claim 25, wherein said dopant is phosphorus, said first set of operating conditions includes a phosphorus dosage lying in a range of between $4\times10^{15}$ cm$^{-2}$ and $4\times10^{15}$ cm$^{-2}$ at an implant energy lying in a range of between 15 and 25 keV, and said second set of operating conditions includes a phosphorus dosage lying in a range of between $1\times10^{15}$ cm$^{-2}$ and $2\times10^{15}$ cm$^{-2}$ and an implant energy of 60 keV.

27. The method of claim 25, wherein said second set of implanting conditions are selected so that the first FET has an effective gate dielectric thicker by a predetermined amount than the second FET.

28. The method of claim 27, wherein said predetermined amount is approximately 20%.

29. The method of claim 25, wherein said second set of implanting conditions includes implanting phosphorus according to a diffusion doping profile which is approximately $1.5\times10^{20}$ cm$^{-3}$ near a gate surface.

30. The method of claim 25, wherein said first FET operates at a first operating frequency and said second FET operates at a second operating frequency.

31. The method of claim 30, wherein said first operating frequency being greater than said second operating frequency.

* * * * *